United States Patent [19]

Dolby

[11] 3,909,737

[45] Sept. 30, 1975

[54] FLOATING ELECTRICAL OUTPUT CIRCUIT

[75] Inventor: Ray Milton Dolby, London, England

[73] Assignee: Dolby Laboratories, Inc., New York, N.Y.

[22] Filed: Sept. 10, 1973

[21] Appl. No.: 395,608

[30] Foreign Application Priority Data

Sept. 12, 1972 United Kingdom .............. 42350/72

[52] U.S. Cl. .................. 330/25; 330/28; 330/30 D; 330/85; 333/14

[51] Int. Cl.² ........................ H03F 1/08; H03G 3/30

[58] Field of Search ......... 330/17, 25, 28, 30 D, 69, 330/32, 149, 85, 9

[56] References Cited

UNITED STATES PATENTS

| | | | |
|---|---|---|---|
| 3,426,241 | 2/1969 | Perkins | 330/30 D X |
| 3,582,802 | 6/1971 | Weekes | 330/30 D |
| 3,723,895 | 11/1971 | Peil | 330/30 D X |

*Primary Examiner*—R. V. Rolinec
*Assistant Examiner*—Lawrence J. Dahl
*Attorney, Agent, or Firm*—Robert F. O'Connell

[57] ABSTRACT

A transformerless floating output circuit is provided by driving two load terminals from amplifying means having differential current outputs. A differential amplifier connected across the load terminals provides a feedback signal which is compared with the input signal to provide a control signal for the amplifying means. The feedback connection regulates the control signal so that the differential currents produce a load voltage matching the input voltage, irrespective of the value of the load impedance and whether or not one load terminal is tied to a fixed potential, such as ground.

4 Claims, 3 Drawing Figures

FLOATING ELECTRICAL OUTPUT CIRCUIT

There are many situations, e.g. in audio equipment, in which it is necessary to provide a floating output stage to electronic equipment; this is customarily achieved by means of an output transformer. Such transformers are expensive and heavy, disadvantages which become particularly severe in the case of multichannel recording installations for example. The object of this invention is to provide a circuit which will yield a floating output without reliance upon transformer action. The circuit can be constructed as an integrated circuit, for example, thereby leading to great savings in bulk, weight and cost.

According to the present invention, there is provided a floating electrical output circuit comprising means for comparing an input signal with a feedback signal to derive a control signal, means for driving amplifying means having differential current outputs from the control signal, the amplifier outputs being coupled to a pair of load terminals across which is further coupled an amplifier circuit whose output is proportional to the voltage between the load terminals and which provides the feedback signal to the comparing means.

The invention and its mode of operation will be described in more detail, by way of example, with reference to the accompanying drawings, in which.

Figure 1:
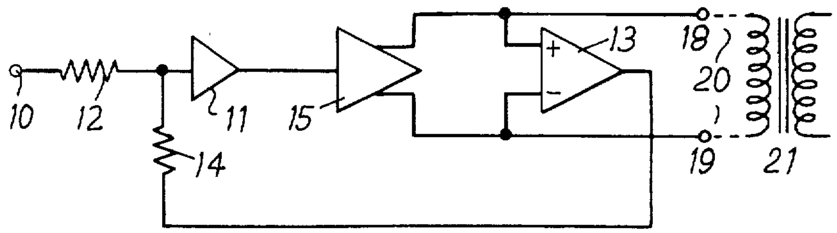
FIG. 1 is a block circuit diagram of one embodiment of the invention.

In FIG. 1 an input terminal 10 is connected to a summing amplifier 11 through an input resistor 12. A feedback signal provided by a differential amplifier 13 is fed to the amplifier 11 through a resistor 14 and the sense of the feedback signal from the differential amplifier is arranged to be opposite to that of the input signal. A control signal proportional to the difference between the input signal and the feedback signal therefore appears at the output of the amplifier 11. It will be appreciated that other means, e.g. a differential amplifier, could be used to compare the input signal and feedback signal to derive the control signal.

A differential current amplifying means 15 has one input driven by the control signal. The other input (not shown) is tied to a reference potential. The amplifier 15 provides differential current outputs and the outputs of the current amplifier are connected to respective load terminals 18 and 19, to which the inputs of the differential amplifier 13 are connected. The load impedance may be that presented by a floating output line 20 connected, for example, to a transformer-coupled input stage 21 of an entirely different piece of electrical equipment.

Irrespective of the value of the load impedance (within a working range) the feedback connection will so rgulate the control signal that the differential currents supplied by the amplifier 15 produce a load voltage, and hence a differential amplifier output voltage, matching the input voltage. This condition obtains whether or not the terminals 18 and 19 are entirely floating or whether, as may sometimes be desired, one of these terminals is tied to a point of arbitrary potential, e.g. by way of one conductor of the line 20.

The input and output voltages are not necessarily equal; a constant of proportionality may be introduced if the differential amplifier 13 has other than unity gain or by suitably proportioning the resistors 12 and 14.

Figure 2:
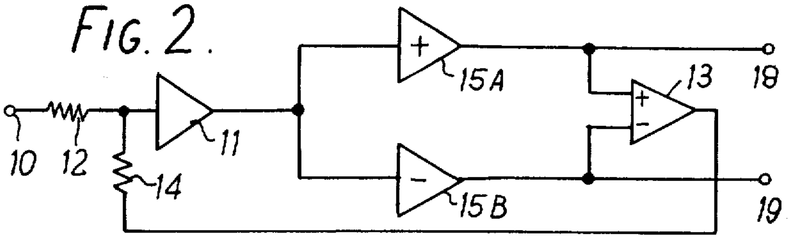
FIG. 2 is a block circuit diagram of one method of producing an amplifying means with differential current outputs.

The amplifying means 15 of FIG. 1 may be realized in the manner shown in FIG. 2, namely as two current amplifiers 15A and 15B with output current versus input voltage ratios which are of opposite sign. A practical circuit appears in FIG. 3. The non-inverting part at the top of the diagram operates as follows.

An input terminal 33 (connected to the output of amplifier 11) drives a differential amplifier 34 whose function is described below, and whose output drives a PNP transistor 35 and a series-connected NPN transistor 36 through a network 37 having a low impedance at audio frequencies. The transistors 35 and 36 provide the current amplification action and their collectors are connected together to an input terminal 38 corresponding to terminal 18 of FIG. 3. If, for example, the potential on the input terminal 33 increases, the potentials on the bases of the transistors 35 and 36 fall to increase the current through 35 and decrease the current through 36, both of which actions act in the same way to increase the potential on the output terminal 38.

The output of the amplifier is smoothed by a low pass filter 39, an emitter follower 40 preferably being interposed to avoid upsetting the level at the collectors of 35 and 36 (a high impedance point). The smoothed signal is applied to the second input of the differential amplifier 34, thereby to establish a negative feedback loop terminal the D.C. conditions, and tending to hold the output terminaal 38 at the same potential as the input terminal 33.

The inverting part of the amplifier at the bottom of FIG. 4 operates in the same manner, except that the signal from terminal 33 is applied via a coupling capacitor 41 to the same input of the differential amplifier as the D.C. feedback, and the output terminal 42 (corresponding to terminal 19 of FIG. 3) is held at approximately ground potential.

Figure 3:
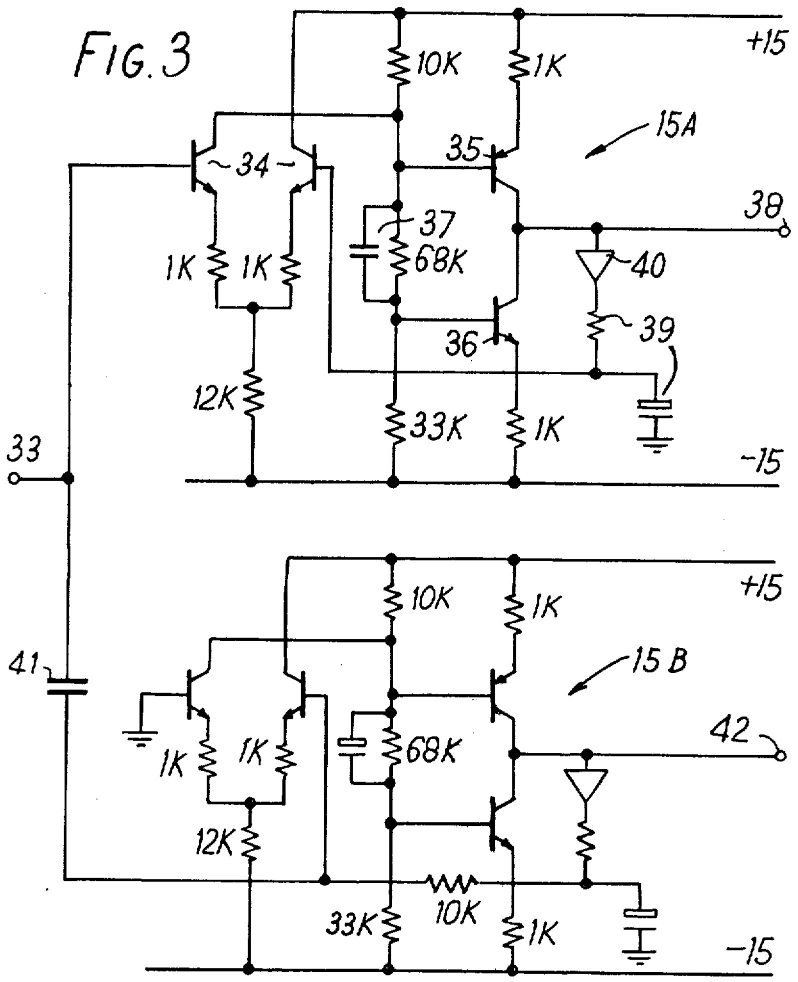
FIG. 3 is a circuit diagram of a practical current amplifier according to FIG. 2 for use at audio frequencies.

When the circuit of FIG. 3 is incorporated in the complete system of FIG. 1, terminal 19 is held at a potential almost equal to that of terminal 18 by the action of the main feedback loop via amplifiers 13 and 11.

The feedback loops ensure that, provided no direct current is taken from the output (coupling capacitors can prevent this), terminals 18 and 19 will take up potentials allowing maximum output signal voltage swing.

I claim:

1. A floating electrical output circuit, comprising means for comparing an input signal with a feedback signal to derive a control signal, amplifying means having differential current outputs, means for applying said control signal to drive said amplifying means, a pair of load terminals coupled to said outputs of said amplifying means, and an amplifier circuit coupled across said load terminals to provide said feedback signal directly proportional to the voltage between the load terminals.

2. A circuit according to claim 1, wherein said amplifying means comprises first and second current amplifiers which are driven in opposite phase in response to the output of the comparing means.

3. A circuit according to claim 2, wherein the voltage output of each current amplifier is coupled to the input of the corresponding amplifier by way of a negative feedback circuit incorporating smoothing means.

4. A circuit according to claim 1, wherein the said amplifier circuit is a differential amplifier having two inputs coupled to the said amplifier outputs respectively, and an output coupled to the comparing means to provide the feedback signal.

* * * * *

UNITED STATES PATENT AND TRADEMARK OFFICE

CERTIFICATE OF CORRECTION

PATENT NO. : 3,909,737

DATED : Sept. 30, 1975

INVENTOR(S) : Ray Milton Dolby

It is certified that error appears in the above-identified patent and that said Letters Patent are hereby corrected as shown below:

Column 1, line 60, change "rgulate" to ---regulate---.

Column 2, line 17, change "input" to ---output---.

line 18, change "FIG. 3" to ---FIG. 2---.

line 30, change "terminaal" to ---terminal---.

line 33, change "FIG. 4" to ---FIG. 3---.

line 37, change "FIG. 3" to ---FIG. 2---.

Signed and Sealed this

Twenty-fourth Day of August 1976

[SEAL]

*Attest:*

RUTH C. MASON
*Attesting Officer*

C. MARSHALL DANN
*Commissioner of Patents and Trademarks*